(12) United States Patent
Ishii et al.

(10) Patent No.: US 8,866,503 B2
(45) Date of Patent: Oct. 21, 2014

(54) WAFER CHUCK INCLINATION CORRECTING METHOD AND PROBE APPARATUS

(75) Inventors: Kazunari Ishii, Nirasaki (JP); Toshihiko Iijima, Nirasaki (JP); Shuji Akiyama, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 662 days.

(21) Appl. No.: 13/071,881

(22) Filed: Mar. 25, 2011

(65) Prior Publication Data

US 2011/0234247 A1    Sep. 29, 2011

(30) Foreign Application Priority Data

Mar. 26, 2010  (JP) ................. 2010-073039

(51) Int. Cl.
*G01R 31/00* (2006.01)
*G01R 31/28* (2006.01)

(52) U.S. Cl.
CPC ........ *G01R 31/2891* (2013.01); *G01R 31/2887* (2013.01)
USPC ............. 324/750.16; 324/750.19; 324/756.03

(58) Field of Classification Search
USPC ................ 324/750.16, 750.19, 750.23, 158.1
See application file for complete search history.

(56) References Cited

U.S. PATENT DOCUMENTS

| | | | | |
|---|---|---|---|---|
| 4,934,064 A | * | 6/1990 | Yamaguchi et al. | 33/645 |
| 6,297,656 B1 | * | 10/2001 | Kobayashi et al. | 324/750.19 |
| 7,583,098 B2 | * | 9/2009 | Tunaboylu et al. | 324/750.16 |
| 7,598,725 B2 | * | 10/2009 | Bosy et al. | 324/750.24 |
| 7,777,511 B2 | * | 8/2010 | Hagihara | 324/756.03 |
| 7,940,065 B2 | * | 5/2011 | Yano et al. | 324/750.16 |
| 8,013,621 B2 | * | 9/2011 | Sano et al. | 324/750.23 |
| 8,030,955 B2 | * | 10/2011 | Yamada et al. | 324/750.16 |
| 8,368,414 B2 | * | 2/2013 | Ko | 324/750.16 |
| 2007/0040549 A1 | * | 2/2007 | Komatsu | 324/158.1 |
| 2008/0150565 A1 | * | 6/2008 | Nayak et al. | 324/758 |

FOREIGN PATENT DOCUMENTS

| | | | |
|---|---|---|---|
| EP | 1258733 A1 | * | 11/2002 |
| EP | 752588 B1 | * | 1/2005 |
| JP | 10-150081 | | 6/1998 |
| JP | 11-30651 | | 2/1999 |
| WO | WO 2010021427 A1 | * | 2/2010 |

* cited by examiner

*Primary Examiner* — Jermele M Hollington
*Assistant Examiner* — Christopher McAndrew
(74) *Attorney, Agent, or Firm* — Oblon, Spivak, McClelland, Maier & Neustadt, L.L.P.

(57) ABSTRACT

A method for correcting inclination of a wafer chuck includes obtaining in advance a correction amount for each of the semiconductor chips which corrects the inclination of the wafer chuck in the case of applying a contact load to at least each one of the semiconductor chips and storing each of the correction amounts in a data storage unit; calculating a total correction amount for correcting the inclination of the wafer chuck by calculating the correction amount of each of the semiconductor chips bringing into contact with the probes when the semiconductor wafer comes into electrical contact with the probes and adding the calculated correction amounts; and correcting the inclination of the wafer chuck based on the total correction amount.

10 Claims, 10 Drawing Sheets

WAFER CHUCK INCLINATION CORRECTING METHOD AND PROBE APPARATUS

CROSS-REFERENCE TO RELATED APPLICATIONS

This application claims priority to Japanese Patent Application No. 2010-073039 filed on Mar. 26, 2010, the entire contents of which are incorporated herein by reference.

FIELD OF THE INVENTION

The present invention relates to a wafer chuck inclination correcting method and a probe apparatus; and, more particularly, to a wafer chuck inclination correcting method capable of correcting inclination of a wafer chuck, which occurs when electrical characteristics of a plurality of semiconductor chips formed on a semiconductor wafer are tested, even in the case of using a probe card having a size that entirely covers the semiconductor chips at the maximum, and a probe apparatus.

BACKGROUND OF THE INVENTION

A probe apparatus is an apparatus for testing electrical characteristics of all semiconductor chips formed on a semiconductor wafer. Generally, the probe apparatus includes a loader chamber for transferring a semiconductor wafer and a prober chamber for testing the electrical characteristics of the semiconductor wafer transferred from the loader chamber.

The prober chamber has a movable wafer chuck for holding the semiconductor wafer, a probe card provided above the wafer chuck, and an alignment mechanism for aligning a plurality of probes of the probe card with a plurality of electrode pads of each of the semiconductor chips formed on the semiconductor wafer held by the wafer chuck. A head plate is provided on a top surface of the probe chamber, and a test head connected to a tester is disposed on the head plate. The tester tests the electrical characteristics of the test head and the semiconductor chips in electrical contact with the probe card.

In recent development of semiconductor devices, high-density and miniaturized wiring structures of semiconductor chips are adopted. Further, a diameter of a semiconductor wafer is increased in order to improve a production yield of the semiconductor chips. Therefore, a probe card is scaled up, and a density of probes is increased. Moreover, a plurality of semiconductor chips needs to be tested simultaneously.

In order to test the electrical characteristics of the semiconductor chips by using the probe apparatus, a semiconductor wafer W held by a wafer chuck 1 is aligned with probes 2 of a probe card and, then, the wafer chuck 1 is raised to bring the electrode pads of the semiconductor chips into contact with the probes 2, as shown in FIG. 9A. Next, the wafer chuck 1 is overdriven, and the probes 2 come into tight contacts with the electrode pads P while scratching the oxide film. Accordingly, the probes 2 are brought into electrical contact with the electrode pads P, and the electrical characteristic test is carried out.

Due to the scaling-up and the high-density of the semiconductor wafer W, when the probes 2 are brought into electrical contact with the electrode pads P of the semiconductor chips formed in the outer circumferential portion of the semiconductor wafer W, the wafer chuck 1 is inclined by an eccentric load applied from the probes 2 to the semiconductor chips. Hence, the right and the left probe 2 are excessively misaligned to respective dashed line positions by an amount of b µm, as illustrated in FIG. 9A. The right probe 2 is misaligned from a solid line position to a dashed line position by an amount larger than a proper misalignment amount, i.e., a µm+b µm, and leaves a deep needle trace, and the left probe 2 is misaligned from a solid line position to a dashed line position by an amount smaller than the proper misalignment amount, i.e., a µm−b µm, and leaves a shallow needle trace, as illustrated in FIGS. 9A and 9B. As the semiconductor wafer W is scaled up, this phenomenon becomes more evident. Accordingly, one of the probes 2 inflicts damages on the electrode pad P, whereas the other probe 2 is not brought into electrical contact with the electrode pad P due to the shallow needle trace.

To that end, the present inventors proposed a probe method capable of solving the above drawbacks in Japanese Patent Application Publication No. H11-30651 and its corresponding U.S. Pat. No. 6,297,656. In this probe method, the inclination of the wafer chuck 1 is calculated in advance, and the excessive misalignment is prevented by moving the wafer chuck 1 in X, Y and Z directions such that the wafer chuck 1 is ultimately inclined in a direction indicated by an arrow of FIG. 10A which is opposite to the direction in which the wafer chuck 1 is inclined when the electrode pads P and the probes 2 are in electrical contact with each other as shown in FIG. 10A. If the inclination of the wafer chuck 1 is corrected by this probe method, the misalignment amounts of the right and the left probe 2 can be controlled to the proper level, i.e., a µm, as shown in FIGS. 10B and 10C, so that the highly reliable electrical characteristic test can be performed.

In addition, a method for correcting inclination of a wafer chuck is disclosed in Japanese Patent Application Publication No. H10-150081.

The conventional wafer chuck inclination correcting method described in Japanese Patent Application Publication Nos. H11-30651 and H10-150081 are effective in testing semiconductor chips formed in the outer circumferential portion of the semiconductor wafer W held by the wafer chuck 1. However, the conventional inclination correcting methods cannot correct the inclination of the wafer chuck 1 in the case of using a probe card having a size which can be brought into contact with all the semiconductor chips of the semiconductor wafer simultaneously.

SUMMARY OF THE INVENTION

In view of the above, the present invention provides a wafer chuck inclination correcting method capable of reliably correcting inclination of a wafer chuck even in the case of using a probe card having a size that covers substantially all semiconductor chips formed on a semiconductor wafer at the maximum and a probe apparatus.

In accordance with a first aspect of the present invention, there is provided a method for correcting inclination of a wafer chuck which occurs when electrical characteristics of a plurality of semiconductor chips of a semiconductor wafer are tested by bringing the semiconductor wafer held by the wafer chuck into electrical contact with a plurality of probes of a probe card at least once, the probe card having a size which covers substantially all the semiconductor chips at the maximum, the method comprising the steps of: (a) obtaining in advance a correction amount for each of the semiconductor chips which corrects the inclination of the wafer chuck in the case of applying a contact load to at least each one of the semiconductor chips and storing each of the correction amounts in a data storage unit; (b) calculating a total correction amount for correcting the inclination of the wafer chuck by calculating the correction amount of each of the semiconductor chips bringing into contact with the probes when the semiconductor wafer comes into electrical contact with the probes and adding the calculated correction amounts; and (c) correcting the inclination of the wafer chuck based on the total correction amount.

In accordance with a second aspect of the present invention, there is provided a probe apparatus including: a wafer chuck for holding a semiconductor wafer having a plurality of semiconductor chips; a probe card, provided above the wafer chuck, having a size which covers substantially all the semiconductor chips at the maximum; a control unit for controlling a moving amount of the wafer chuck and correcting inclination of the wafer chuck which occurs when the semiconductor wafer and the probe card are brought into electrical contact with each other. Electrical characteristics of the semiconductor chips are tested by brining the probe card into electrical contact with the semiconductor wafer at least once under the control of the control unit.

The control unit includes a data storage unit storing a correction amount, which has been obtained in advance for each of the semiconductor chips to correct the inclination of the wafer chuck in the case of applying a contact load to each one of the semiconductor chips, for each of the semiconductor chips.

Further, the control unit calculates a total correction amount for correcting the inclination of the wafer chuck by calculating the correction amount for each of the semiconductor chips bringing into contact with the probes when the semiconductor wafer is brought into electrical contact with the probes and adding the calculated correction amounts, and corrects the inclination of the wafer chuck based on the total correction amount.

BRIEF DESCRIPTION OF THE DRAWINGS

The objects and features of the present invention will become apparent from the following description of embodiments, given in conjunction with the accompanying drawings, in which:

FIGS. 9A to 9C are explanatory views for explaining inclination of the wafer chuck in the case of testing electrical characteristics of the semiconductor chips formed in the outer circumferential portion of the semiconductor wafer, wherein FIG. 9A is a side view showing relationship between the wafer chuck and the probes, FIG. 9B is a cross sectional view showing relationship between the probes and electrode pads, and FIG. 9C is a top view of the electrode pads of FIG. 9B.

DETAILED DESCRIPTION OF THE EMBODIMENTS

Hereinafter, an embodiment of the present invention will be described with reference to FIGS. 1 to 8 which form a part hereof. A probe apparatus in accordance with an embodiment of the present invention will be described prior to description of a wafer chuck inclination correcting method of the present invention.

Figure 1:
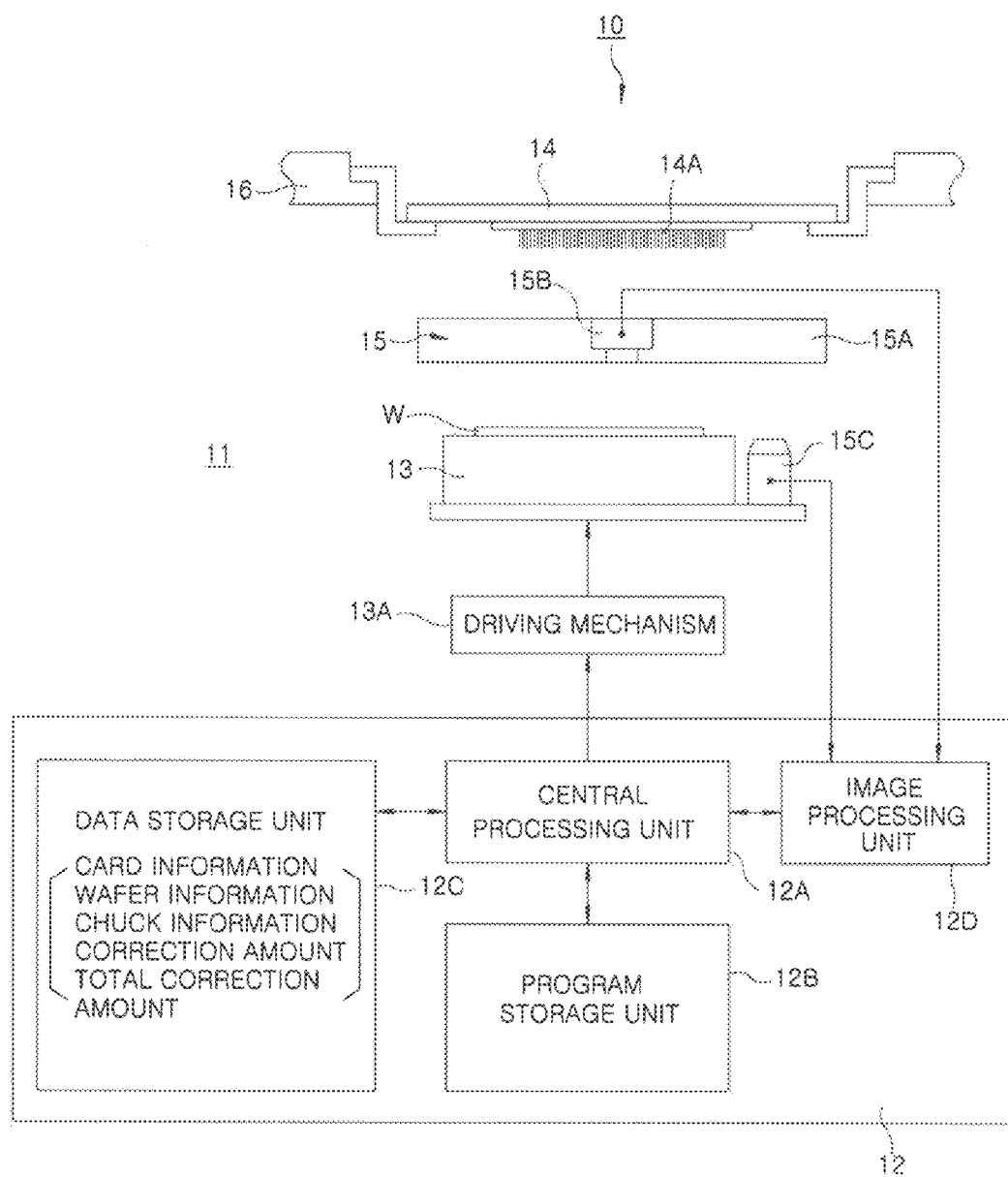
FIG. 1 is a conceptual view showing a probe apparatus in accordance with an embodiment of the present invention.

As shown in FIG. 1, a probe apparatus 10 of the present embodiment includes a loader chamber (not shown) having a wafer transfer mechanism for transferring a semiconductor wafer W, a prober chamber 11 for testing electrical characteristics of the semiconductor wafer W, and a control unit 12 for controlling various devices in the loader chamber and the prober chamber 11. The semiconductor wafer W transferred from the loader chamber is received in the prober chamber 11 through the wafer transfer mechanism, and the electrical characteristics of the semiconductor wafer W are tested under the control of the control unit 12.

As shown in FIG. 1, the prober chamber 11 includes a wafer chuck 13 which is capable of moving in X, Y, Z and θ directions through a driving mechanism 13A while holding the semiconductor wafer W having a plurality of semiconductor chips, a probe card 14 provided above the wafer chuck 13, and an alignment mechanism 15 for aligning a plurality of probes 14A of the probe card 14 with a plurality of electrode pads of the semiconductor wafer W held by the wafer chuck 13.

As shown in FIG. 1, the probe card 14 is installed at the opening of the head plate 16 which forms a top surface of the prober chamber 11. The alignment mechanism 15 includes: an alignment bridge 15A moving between an innermost side of the probe chamber 11 and a probe center; a first CCD camera 15B, installed at the alignment bridge 15A, for capturing an image of the semiconductor wafer W held by the wafer chuck 13; and a second CCD camera 15C, provided at the side of the wafer chuck 13, for capturing an image of the probes 14A of the probe card 14.

Figure 2:
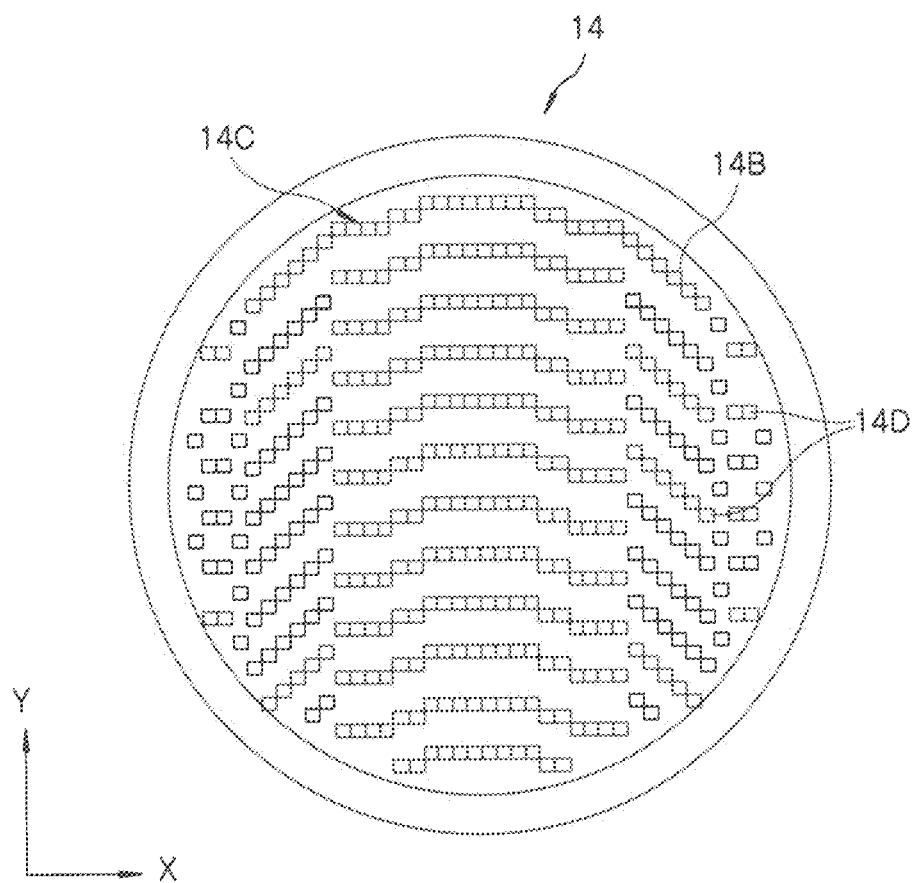
FIG. 2 is a top view showing probes of a probe card used in the probe apparatus shown in FIG. 1.
Figure 3:
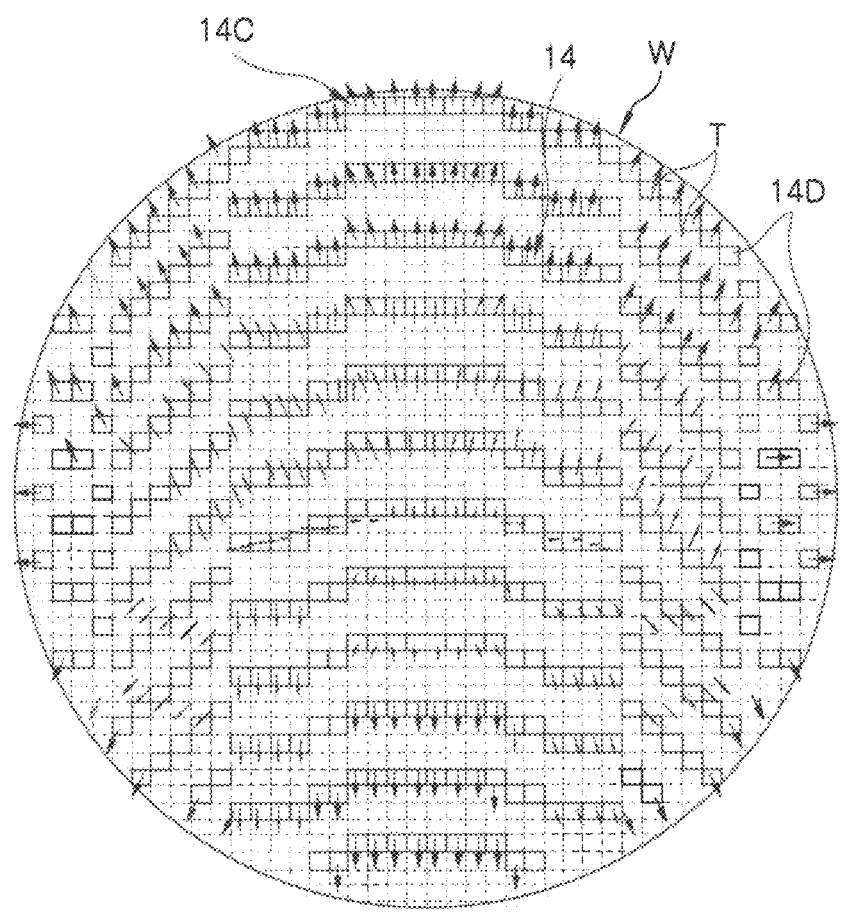
FIG. 3 shows a distribution state of a contact load applied from the probes of the probe card shown in FIG. 2 to each of semiconductor chips of a semiconductor wafer.

As shown in FIG. 2, the probe card 14 has multiple rows of probes 14C, each row of probes being arranged in a circular arc shape on a circuit substrate 143 in accordance with the arrangement of semiconductor chips T of the semiconductor wafer W. Each row of probes 14C has a plurality of chip areas 14D arranged in a circular arc shape, each of chip areas 14D having a size corresponding to the size of a single semiconductor chip T. Each of the chip areas 14D has the number of the probes 14A corresponding to the number of electrode pads formed in the semiconductor chip T. Moreover, the rows of probes 14C are arranged in the Y direction such that the rows of probes 14C contain chip areas 14D arranged in the Y direction to correspond to every fourth semiconductor chips T disposed in the Y direction as shown in FIG. 3. Thus, the electrical characteristics of all the semiconductor chips T of the semiconductor wafer W can be tested by performing index feeding four times (see FIGS. 7A to 7C and 8). Since the rows of probes 14C are formed to correspond to every fourth semiconductor chips T, the rows of probes 14C do not interfere with neighboring rows of semiconductor chips T in the Y direction.

However, it is difficult to manufacture the probe card as designed. The probes 14A are different from each other in lengths, materials, arrangement types or the like, and different probe cards have different characteristics. As in the case of the probe card 14, it is also difficult to manufacture the wafer chuck 13 as designed. The mechanical characteristics of the wafer chuck 13 such as a mechanical strength of a mounting surface, fine irregularities on the mounting surface, and further a mechanical strength of a rotation shaft and the like are different, and different wafer chucks have different characteristics.

Figure 4:
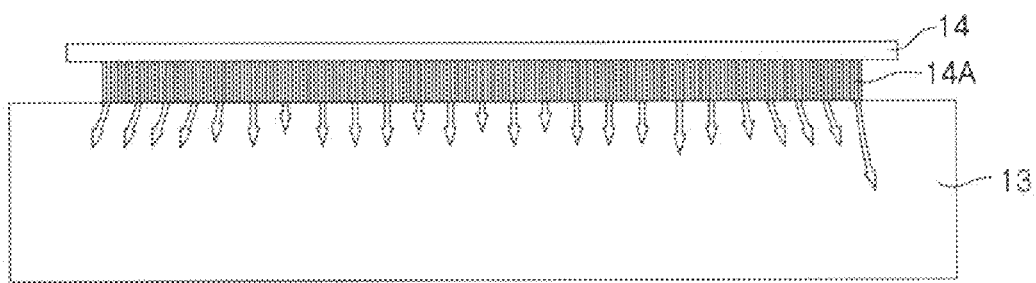
FIG. 4 shows a magnitude of the contact load shown in FIG. 3 which is viewed from a wafer chuck side.
Figure 5A:
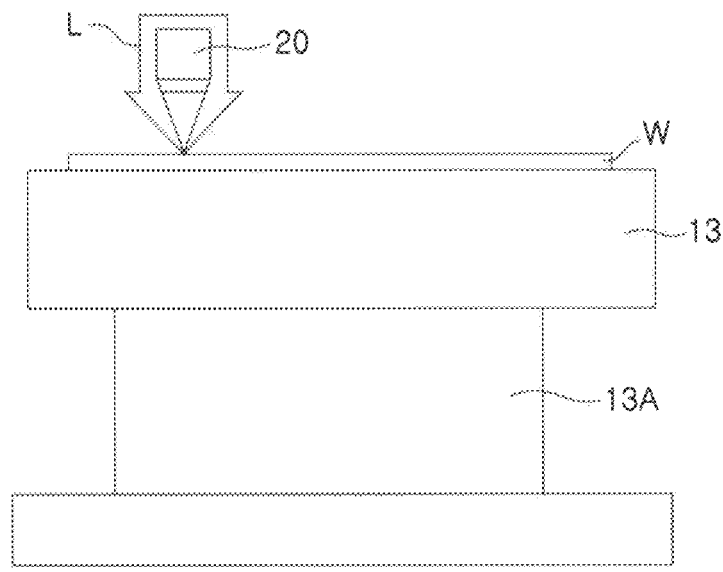
FIG. 5A is a side view of a camera measuring system used for measuring the contact load applied to each of the semiconductor chips formed on the entire surface of the semiconductor wafer.
Figure 5B:
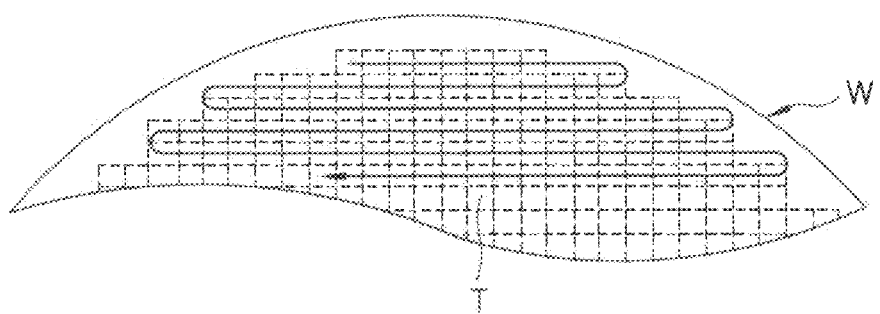
FIG. 5B is an explanatory view for explaining a sequence for measuring the contact load applied to each of the semiconductor chips of the semiconductor wafer.

Therefore, it is not possible to bring the wafer chuck 13 into electrical contact with the probes 14A of the probe card 14 with a uniform contact load over the entire region. For example, when the probe card 14 shown in FIG. 2 is brought into electrical contact with the semiconductor wafer W, the contact load of various magnitudes and directions is applied by the probe pressure. The distribution of the contact load is shown in FIG. 3. In FIG. 3, the arrows indicate the magnitudes (the thicker arrow indicates the greater magnitude) and the directions of the contact load. As can be seen from FIG. 3 (the longer arrow indicates the greater contact load), the larger contact load is applied substantially at the outer circumferential portion of the semiconductor wafer W and becomes smaller at the central portion of the semiconductor wafer W. FIG. 4 corresponds to FIG. 3 and illustrates the distribution of the contact load on the wafer chuck 13.

Therefore, in order to uniformly distribute the contact load, the present embodiment provides a testing program including a wafer chuck inclination correcting program used in the control unit 12 (hereinafter, simply referred to as an "inclination correcting program").

Thus, the mechanical characteristics of the wafer chuck 13 and the probe card 14 can be obtained in advance, so that the contact load between the probes 14A and the semiconductor wafer W held by the wafer shuck 13 can be corrected to be uniform, and the inclination of the wafer chuck 13 can be corrected even in the case of using the probe card 14 having a size that covers substantially the entire chip areas of the semiconductor wafer W. As a result, the probes 14A can be brought into electrical contact with the wafer chuck 13 with the extremely uniform contact load, and the highly reliable test can be carried out. The following is a description of the control unit 12 in which the inclination correcting program of the present embodiment is stored.

The control unit 12 of the present embodiment includes a central processing unit 12A, a program storage unit 12B, a data storage unit 12C and an image processing unit 12D, as can be seen from FIG. 1. The central processing unit 12A reads out the testing program including the inclination correcting program from the program storage unit 12B and drives the alignment mechanism to align the semiconductor wafer W with the probe card 14. Next, the semiconductor wafer W is index-fed by the wafer chuck 13, thereby testing electrical characteristics of the semiconductor chips.

The program storage unit 12B stores inclination correcting program. When this program is executed, the inclination of the wafer chuck 13 is corrected based on the flowchart shown in FIG. 6. The data storage unit 12C stores various data including card information, wafer information, chuck information, a correction amount of the wafer chuck 13 for each semiconductor chip, and a total correction amount of the wafer chuck 13, as illustrated in FIG. 1.

The card information includes parameters, e.g., the number of probes 14A of the probe card 14, materials of the probes 14A, arrangement types of the rows of probes 14C, the number of probes 14A provided in each chip area 14D and the like. The wafer information includes parameters, e.g., the number of semiconductor chips T, a size and an area of a semiconductor chip T, the number of electrode pads P of each of the semiconductor chips T, a pitch between the electrode pads and the like. The chuck information includes parameters, e.g., an outer diameter of the wafer chuck 13, a mechanical strength of the rotation shaft and the like. The correction amount for each semiconductor chip T is obtained before the test of the semiconductor wafer W is carried out. The wafer chuck correction amount for the semiconductor chips T is calculated based on the number of semiconductor chips T to be in electrical contact with the probes 14A in case where the probe card 14 shown in FIG. 2 comes into electrical contact with the wafer chuck 13.

In order to obtain the characteristics of the wafer chuck 13, the correction amount is obtained before the probe apparatus 10 is used. Hereinafter, a method for obtaining the correction amount for each semiconductor chip by using a camera measuring system shown in FIG. 5A will be described. The semiconductor wafer W held by the wafer chuck 13 is index-fed by moving the wafer chuck 1 under the control of the control unit 12. For example, an i-th semiconductor chip (xi, yi) from a first semiconductor chip T to be tested is moved to a position where an air assist mechanism L comes into contact with it. Next, the wafer chuck 13 is raised so that a load of w [gf] can be applied to the i-th semiconductor chip (xi, yi) by using the air assist mechanism L. When the contact load is applied, actual vertical misalignment amounts (displacement) $V(\theta x)$ [μm] and $V(\theta y)$[μm] at the measurement point are measured by using the camera 20 and, at the same time, actual vertical displacement V (center)[μm] at the center of the semiconductor wafer W is measured by using another camera. Further, horizontal displacements $H(\theta x)$[μm] and $H(\theta y)$[μm] of the semiconductor chip (xi, yi) in the X and Y directions are measured by using the camera 20. Here, the central processing unit 12A can obtain an overdrive amount Z[μm] during measurement based on the difference between the vertical displacement V (center)[μm] and a preset overdrive amount OD[μm]. Such data is stored in the data storage unit 12C of the control unit 12.

Next, a contact load between the semiconductor chip (xi, yi) and the probes 14A is calculated. Suppose when the wafer chuck 13 is overdriven by the preset overdrive amount OD[μm], a pin pressure P[gf] of the n-number of probes is applied to the semiconductor wafer and a ratio of the contact area of one semiconductor chip to the area of the semiconductor wafer W is set to A (%). Here, the coordinates (xi, yi) of the semiconductor chip indicate coordinates of a center of gravity of the semiconductor chip T. Thereafter, the central processing unit 12A substitutes the obtained values into the following equation (1) read out from the data storage unit 12C, so that the contact load of the semiconductor chip (xi, yi) can be calculated based on the pin pressure P[gf] applied to the i-th semiconductor chip (xi, yi):

$$f[gf]=(n \times P \times OD \times A)/(100 \times Z) \qquad \text{Eq. (1)}.$$

Next, the central processing unit 12A sequentially performs the following calculations in the above-described manner. In other words, the vertical displacements Vxi[μm] and Vyi[μm] of the semiconductor chip (xi, yi) in the X and Y directions can be calculated by substituting into the following equations (2) and (3) the contact load f[gf], a distance from the center of the semiconductor wafer to the measurement point R[μm], a load w[gf] applied during measurement, the vertical displacement V(θ)[μm] at the measurement point and the vertical displacement V (center)[μm] at the center of the semiconductor wafer:

$$Vxi[\mu m]=[(xi \times f) \times (V(\theta x)-V(center))]/(R \times w) \quad \text{Eq. (2)};$$

and $$Vyi[\mu m]=[(yi \times f) \times (V(\theta y)-V(center))]/(R \times w) \quad \text{Eq. (3)}.$$

Further, a vertical displacement Vi[μm] of the i-th semiconductor chip (xi, yi) can be calculated based on the following equation (4) by combining the vertical displacements in the X and Y directions which are obtained from the equations (2) and (3):

$$Vi[\mu m]=\sqrt{(Vxi^2+Vyi^2)}+[f \times V(center)]/w \quad \text{Eq. (4)}.$$

Meanwhile, horizontal displacements Hxi[μm] and Hyi [μm] of the i-th semiconductor chip (xi, yi) in the horizontal direction (the X and Y directions) can be calculated based on the following equations (5) and (6):

$$Hxi=[xi \times f \times H(\theta x)]/(R \times w) \quad \text{Eq. (5); and}$$

$$Hyi=[yi \times f \times H(\theta y)]/(R \times w) \quad \text{Eq. (6)}.$$

The data obtained from the equations (4) to (6) is used as a correction amount for correcting the inclination of the wafer chuck 13 for each semiconductor chip. The correction amount thus obtained is stored in the data storage unit 12C as described above.

Moreover, vertical displacements V and horizontal displacements Hx and Hy in the X and Y directions of a plurality of semiconductor chips shown in FIG. 2 can be calculated by substituting the data of each semiconductor chip obtained from the aforementioned equations into the following equations (7) to (9):

$$V=\Sigma Vi \quad \text{Eq. (7)};$$

$$Hx=\Sigma Hxi \quad \text{Eq. (8); and}$$

$$Hy=\Sigma Hyi \quad \text{Eq. (9)}.$$

The correction amount thus obtained and the total correction amount are stored as the characteristics of the wafer chuck 13 and the probe card 14 in the data storage unit 12C.

Figure 6:
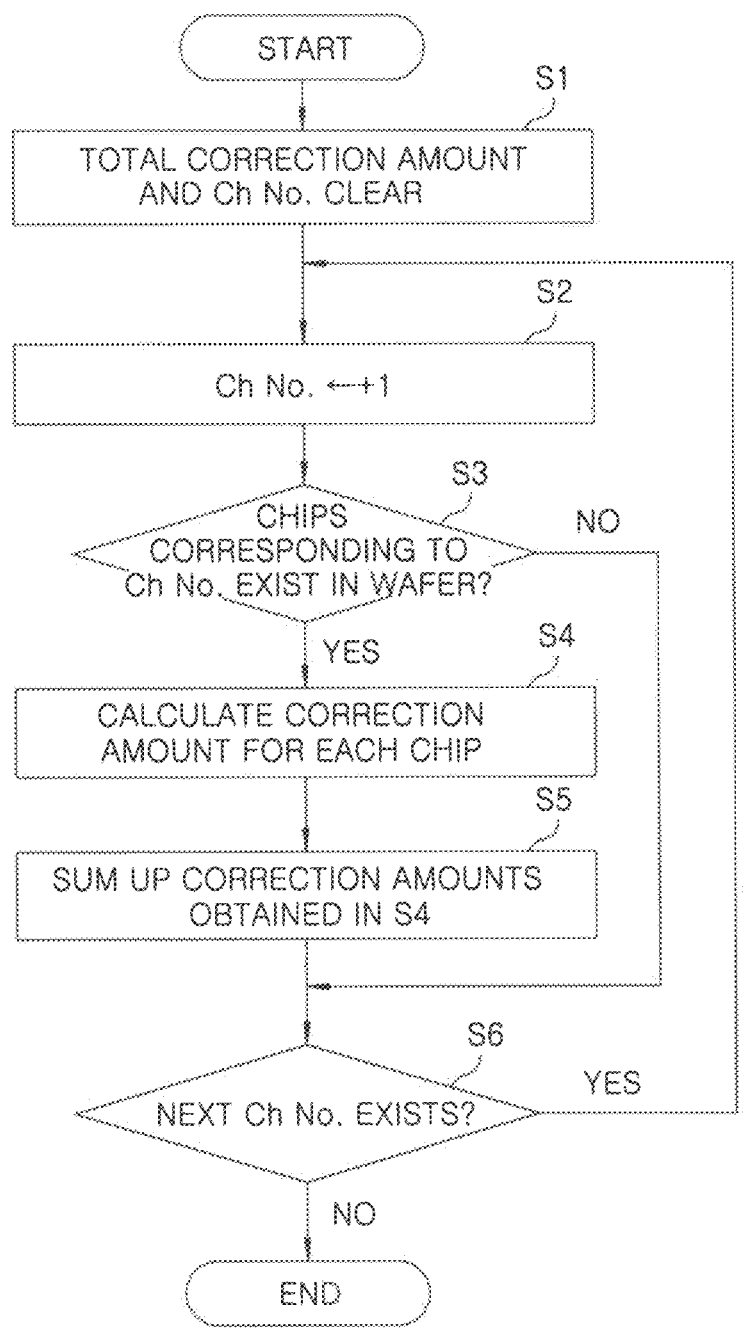
FIG. 6 is a flowchart of a wafer chuck inclination correcting method in accordance with the embodiment of the present invention.
Figure 7A:
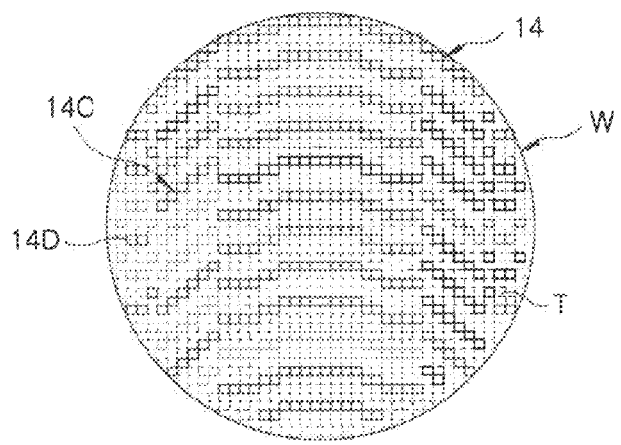
FIGS. 7A to 7C show contact states between the probe card and the semiconductor wafer that has been index-fed in order to test electrical characteristics of the semiconductor chips of the semiconductor wafer by using the probe card shown in FIG. 2.
Figure 7B:
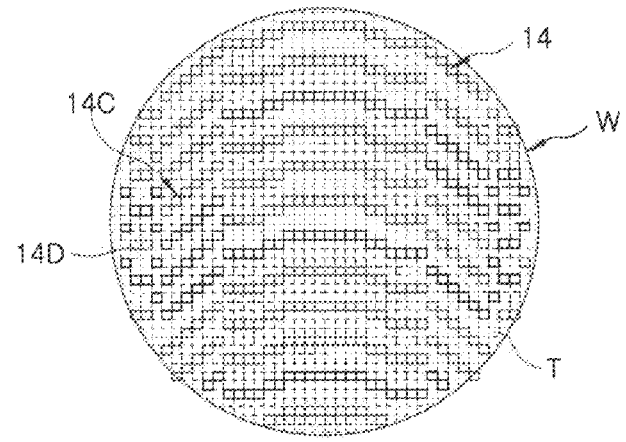
Figure 7C:
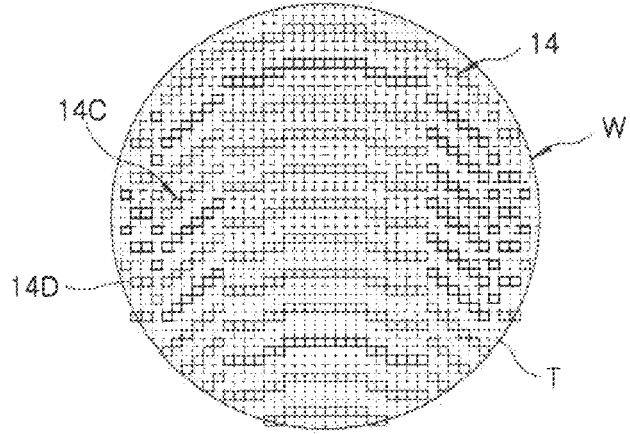
Figure 8:
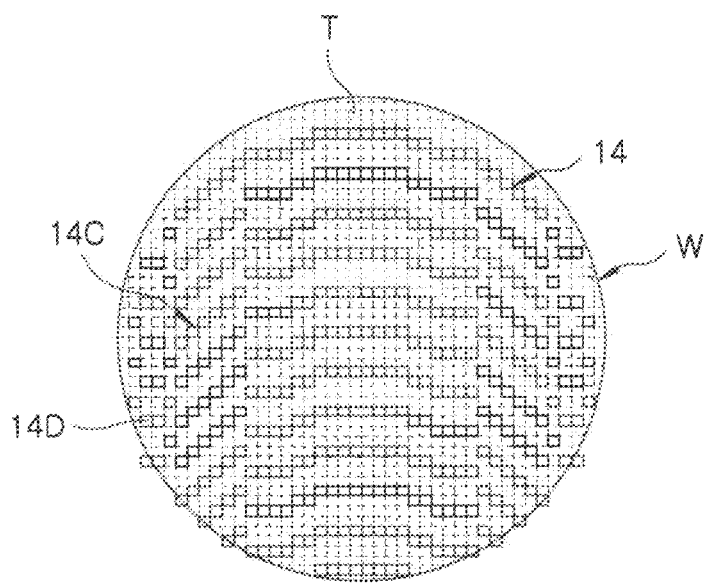
FIG. 8 is an explanatory view showing a contact state between the probe card and the semiconductor wafer that has been index-fed after the process shown in FIG. 7A to 7C.
Figure 9A:
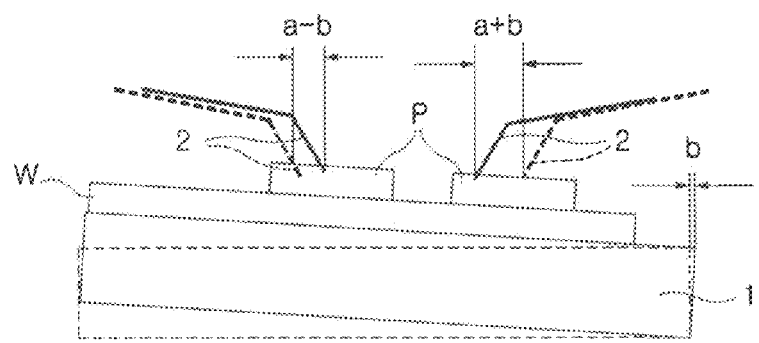
Figure 9B:
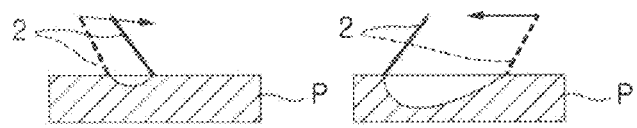
Figure 9C:
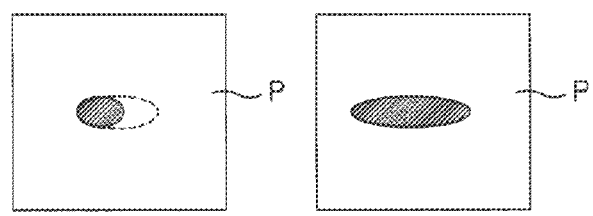
Figure 10A:
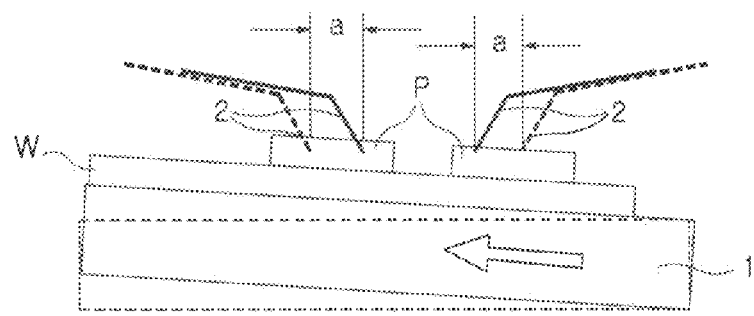
FIGS. 10A to 10C are explanatory views corresponding to FIGS. 9A to 9C and describe a conventional wafer chuck inclination correcting method used in the case of performing the electrical characteristic test.
Figure 10B:
Figure 10C:
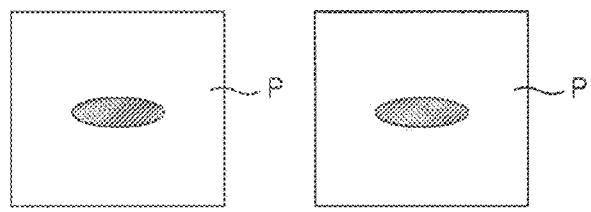

Hereinafter, a wafer chuck inclination correcting method in accordance with the embodiment of the present invention will be described with reference to FIGS. 6 to 8. In the control unit 12 of the probe apparatus 10 of the present embodiment, the inclination correcting program is stored in the program storage unit 12B, and the correction amount for each semiconductor chip which is calculated as described above is stored as the characteristics of the wafer chuck 13 in the data storage unit 12C.

In order to test the electrical characteristics of the semiconductor wafer, the central processing unit 12A reads out the inclination correcting program from the program storage unit 12B and the correction amount for each semiconductor chip from the data storage unit 12C. The total correction amount is obtained by adding the correction amounts for the respective semiconductor chips bringing into contact with the probes 14A of the probe card 14. The inclination of the wafer chuck 13 is corrected by using the total correction amount.

In other words, after the semiconductor wafer W is aligned with and the probe card 14, the electrical characteristics of the semiconductor wafer W are tested under the control of the control unit 12. When the wafer chuck inclination correcting method is performed to carry out the test, first of all, the previously executed total correction amount and the channel number of the probe card 14 are cleared, the channel number corresponding to each chip area 14D in contact with the probes 14C of the probe card 14 as shown in FIG. 2 (step S1). The semiconductor wafer W is index-fed by the wafer chuck 13 such that a plurality of semiconductor chips T to be tested first is positioned directly below the probe card 14. The wafer chuck 13 is raised from this position and comes into contact with the probes 14A of the probe card 14. Then, the wafer chuck 13 is raised by a preset overdrive amount so as to be brought into electrical contact with the probes 14A as shown in FIG. 7A while the inclination of the wafer chuck 13 is corrected based on the pre-calculated total correction amount of the wafer chuck.

Here, the central processing unit 12A checks the presence of first contact semiconductor chip T corresponding to the channel number of the probes 14A based on the card information and the wafer information (step S2). Next, it is determined whether or not the semiconductor chip T corresponding to the channel number of the probes 14A exists in the semiconductor wafer W (step S3). If the semiconductor chip T corresponding thereto do no exist, it is determined whether or not a next channel number exists (Step S6). If the next channel number exists, the process returns to the step S2. In the step S2, the channel number is changed to a next one. In the step S3, it is determined whether or not the semiconductor chip T corresponding to the next channel number exists. If the semiconductor chip T corresponding thereto exists, the correction amount for each semiconductor chip T bringing into contact with the probes 14A is calculated (step S4). The correction amounts for the semiconductor chips T obtained in step S4 are summed up (step S5). If a next channel number exists, the process returns to the step S2. Otherwise, the process is completed. The total correction amount is obtained by adding the correction amounts of all the channel numbers. The inclination of the wafer chuck 13 is corrected by moving the wafer chuck 13 in the X and Y directions based on the total correction amount. Upon completion of the correction of the inclination, the electrical characteristics of each semiconductor chip T are tested.

Upon completion of the first test, it is determined whether or not next semiconductor chips T to be tested exist based on the card information and the wafer information. In the present embodiment, semiconductor chips T as second test targets exist as shown in FIG. 7B. Therefore, the process returns to the step S1, and the operations from the step S1 to the step S6 are repeated. After the second test is completed in the above-described manner, the operations from the step S1 to the step S6 are repeated until the fourth test shown in FIG. 8 is completed.

As described above, in accordance with the present embodiment, the probe apparatus 10 performs the steps of: (a) obtaining in advance a correction amount for correcting the inclination of the wafer chuck 13 in the case of applying a contact load to each one of the semiconductor chips T and storing the correction amount in the data storage unit; (b) calculating a correction amount for each of the semiconductor chips T bringing into contact with the probes 14A when the semiconductor wafer W comes into electrical contact with the probes 14A and calculating a total correction amount for correcting the inclination of the wafer chuck by adding the correction amounts for the respective semiconductor chips; and (c) correcting the inclination of the wafer chuck 13 based on the total correction amount. Accordingly, the inclination of the wafer chuck 13 can be corrected even in the case of using the probe card 14 having a size that covers the entire semiconductor chip area of the semiconductor wafer W and, further, the highly reliable test can be performed. Moreover, the inclination of the wafer chuck 13 can be corrected regardless of the arrangement types of the probes 14A.

Further, in accordance with the present embodiment, a correction amount for each of the semiconductor chips is calculated based on a vertical misalignment amount measured in the case of applying a load to each of the semiconductor chips T and a first total correction amount is calculated in case where the semiconductor wafer W and the wafer chuck 13 are in electrical contact with each other. Therefore, the inclination of the wafer chuck 13 can be corrected based on the total correction amount, and the semiconductor wafer W can be brought into electrical contact with the probe card 14 with an optimal contact load. Further, since the camera 20 of the camera measuring system is used, the correction amount of the wafer chuck for each semiconductor chip can be accurately obtained in advance.

The present invention is not limited to the above-described embodiments. For example, in the present embodiment, the probe card 14 has a plurality of the probes 14A that can cover substantially the entire region of the semiconductor wafer W and the electrical characteristics test is carried out in multiple times to test all the semiconductor chips T. However, a probe card having probes that can be in contact with all the semiconductor chips T at once may be used. Further, a probe card that can cover a comparatively large area of the semiconductor wafer may be used to perform the electrical characteristics test without being limited to the probe card that can cover the entire region of the semiconductor wafer. Moreover, in the above-described embodiments, when the correction amount is measured by the camera measuring system, the load is applied by using the air assist mechanism. However, the load can also be applied by another device other than the air assist mechanism. Furthermore, the measuring system may use laser beam other than the camera. In addition, when the correction amount is calculated, the contact load can be applied to the semiconductor wafer by using the probe card having the probes that can be brought into contact with one or more semiconductor chips.

In accordance with the embodiment of the present invention, it is possible to provide the wafer chuck inclination correcting method capable of reliably correcting inclination of a wafer chuck even in the case of using a probe card having a size that can cover all semiconductor chips formed on a semiconductor wafer and a probe apparatus.

While the invention has been shown and described with respect to the embodiments, it will be understood by those skilled in the art that various changes and modification may be made without departing from the scope of the invention as defined in the following claims.

What is claimed is:

1. A method for correcting a first inclination of a wafer chuck which occurs when electrical characteristics of a plurality of semiconductor chips of a semiconductor wafer are tested by bringing the semiconductor wafer held by the wafer chuck into electrical contact with a multiplicity of probes of a probe card at least once, the probe card having a size which covers substantially all the semiconductor chips, the method comprising the steps of:

(a) measuring first displacements for each of the semiconductor chips by applying a load to each of the semiconductor chips and storing the first displacements in a data storage unit;

(b) calculating a contact load of each of the semiconductor chips occurring when the semiconductor wafer comes into electrical contact with the probes;

(c) calculating second displacements of each of the semiconductor chips based on the first displacements and the contact load of a corresponding semiconductor chip and storing the second displacements as a correction amount of each of the semiconductor chips in the data storage unit;

(d) overdriving the wafer chuck to render the probes to make electrical contact with at least a part of the semiconductor chips;

(e) obtaining correction amounts of semiconductor chips which contact with the probes of the probe card having the size which covers substantially all the semiconductor chips by said overdriving and calculating a total correction amount by adding the obtained correction amounts; and (f) correcting the first inclination of the wafer chuck prior to a measurement of the electrical characteristics of substantially all the semiconductor chips to arrive at a second inclination by adjusting an incline of the wafer chuck based on the total correction amount obtained by adding the obtained correction amounts.

2. The method of claim 1, wherein, the first displacements include a vertical displacement occurring at a center of the semiconductor wafer and the contact load is obtained based on the vertical displacement.

3. The method of claim 2, wherein the first displacements are obtained by an optical unit.

4. The method of claim 3, wherein the optical unit includes a camera.

5. The method of claim 1, wherein the step (d) to the step (f) are repeatedly performed.

6. The method of claim 2, wherein the step (d) to the step (f) are repeatedly performed.

7. The method of claim 3, wherein the step (d) to the step (f) are repeatedly performed.

8. The method of claim 4, wherein the step (d) to the step (f) are repeatedly performed.

9. A probe apparatus comprising:

a wafer chuck for holding a semiconductor wafer having a plurality of semiconductor chips;

a probe card, provided above the wafer chuck, having a size which covers substantially all the semiconductor chips;

a control unit for controlling a moving amount of the wafer chuck and correcting a first inclination of the wafer chuck which occurs when the semiconductor wafer and the probe card are brought into electrical contact with each other, wherein electrical characteristics of the semiconductor chips are tested by bringing the probe card into electrical contact with the semiconductor wafer at least once under the control of the control unit, wherein the control unit includes a data storage unit and is configured to perform (a) measuring first displacements for each of the semiconductor chips by applying a load to each of the semiconductor chips and storing the first displacements in the data storage unit; (b) calculating a contact load of each of the semiconductor chips occurring when the semiconductor wafer comes into electrical contact with the probes; (c) calculating second displacements of each of the semiconductor chips based on the first displacements and the contact load of a corresponding semiconductor chip and storing the second displacements as a correction amount of each of the semiconductor chips in the data storage unit; (d) overdriving the wafer chuck to render the probes to make electrical contact with at least a part of the semiconductor chips; (e) obtaining correction amounts of semiconductor chips which contact with the probes of the probe card having the size which covers substantially all the semiconductor chips by said overdriving and calculating a total correction amount by adding the obtained correction amounts; and (f) correcting the first inclination of the wafer chuck prior to a measurement of the electrical characteristics of substantially all the semiconductor chips to arrive at a second inclination by adjusting an incline of the wafer chuck based on the total correction amount obtained by adding the obtained correction amounts.

10. The probe apparatus of claim 9, wherein, the first displacements include a vertical displacement occurring at a center of the semiconductor wafer and the contact load is obtained based on the vertical displacement.

\* \* \* \* \*